(12) United States Patent
Chang et al.

(10) Patent No.: US 9,023,723 B2
(45) Date of Patent: May 5, 2015

(54) METHOD OF FABRICATING A GATE-ALL-AROUND WORD LINE FOR A VERTICAL CHANNEL DRAM

(71) Applicants: Chorng-Ping Chang, Saratoga, CA (US); Er-Xuan Ping, Fremont, CA (US); Judon Tony Pan, Saratoga, CA (US)

(72) Inventors: Chorng-Ping Chang, Saratoga, CA (US); Er-Xuan Ping, Fremont, CA (US); Judon Tony Pan, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 13/986,515

(22) Filed: May 9, 2013

(65) Prior Publication Data

US 2013/0323920 A1 Dec. 5, 2013

Related U.S. Application Data

(60) Provisional application No. 61/689,238, filed on May 31, 2012.

(51) Int. Cl.
*H01L 27/108* (2006.01)
(52) U.S. Cl.
CPC ..... *H01L 27/10844* (2013.01); *H01L 27/10885* (2013.01); *H01L 27/10891* (2013.01)
(58) Field of Classification Search
CPC .................. H01L 27/10873; H01L 27/10882; H01L 27/10885; H01L 27/10981

USPC .................................... 438/586; 257/E21.659
See application file for complete search history.

(56) References Cited

U.S. PATENT DOCUMENTS

| 5,926,715 | A | 7/1999 | Fan et al. ....................... 438/305 |
| 6,072,209 | A | 6/2000 | Noble et al. ................... 257/296 |
| 6,551,874 | B2 | 4/2003 | Pohl et al. ..................... 438/243 |
| 6,734,484 | B2 | 5/2004 | Wu ................ 257/301 |
| 2010/0165693 | A1 | 7/2010 | Ohgami .......................... 365/51 |
| 2011/0080766 | A1 | 4/2011 | Chang ........................... 365/148 |
| 2011/0151674 | A1 | 6/2011 | Tang et al. .................... 438/715 |
| 2011/0176356 | A1 | 7/2011 | Kajigaya ....................... 365/149 |
| 2011/0261631 | A1 | 10/2011 | Yoshida ................... 365/189.11 |

OTHER PUBLICATIONS

Colinge, J., "Multiple-gate SOI MOSFETS." Solid-State Electronics. 2004. pp. 897-905.
Walder, et al., "FT-IR Measurement of PSG and BPSG Films, Part I: IR Principles and K-matrix Approach." Thermo Scientific. Application Note: 50637 (4 pages). 2008.
Wu, et al., "Symmetric Vertical-Channel Nickel-Salicided Poly-Si Thin-Film Transistors With Self-Aligned Oxide Overetching Structures." IEEE Transactions on Electron Devices, vol. 58, No. 7. 2011. pp. 2008-2013.

*Primary Examiner* — Tom Thomas
*Assistant Examiner* — John Bodnar
(74) *Attorney, Agent, or Firm* — Shirley L. Church, Esq.

(57) ABSTRACT

A method of fabricating a self-aligned buried wordline in a structure which contains a self-aligned buried bit line, where the overall structure which makes up a portion of a vertical channel DRAM. The materials and processes used enable self-alignment of elements of the buried wordline during the fabrication process. In addition, the materials and processes used enable for formation of individual DRAM cells which have a buried bit line width which is 16 nm or less and a perpendicular buried wordline width which is 24 nm or less.

10 Claims, 10 Drawing Sheets

METHOD OF FABRICATING A GATE-ALL-AROUND WORD LINE FOR A VERTICAL CHANNEL DRAM

BACKGROUND OF THE INVENTION

1. Technology Field

The present application is related to a particularly compact structure comprising a plurality of vertical channel DRAM cells, with each cell having a self-aligned buried bit line and a gate-all-around word line, and to a method of fabricating this compact structure. The present application was filed simultaneously with a related application which relates to fabrication of a self-aligned buried bit line for a vertical channel DRAM. The related application number is 61/689,266, filed on May 31, 2012 and is entitled: "Method Of Fabricating A Self-Aligned Buried Bit Line For A Vertical Channel DRAM". This related application is hereby incorporated by reference in its entirety.

2. Description of the Background

This section describes background subject matter related to the disclosed embodiments of the present invention. There is no intention, either express or implied, that the background art discussed in this section legally constitutes prior art.

Technology for producing DRAM structures having a 30 nm to 40 nm half pitch has recently been described in the semiconductor processing industry. As part of the constant desire for shrinking the size of device structures, we have been developing vertical channel DRAM structures including trench feature sizes in the range of 5 nm to 10 nm. However, to achieve this goal, it is necessary to develop a different overall device design and a new process for manufacturing the device, both from a point of fabrication feasibility and with an eye on performance stability and reliability.

DRAM devices of a kind currently known in the industry are typically part of an integrated circuit structure and include a bit line and a word line which extends at an angle relative to the bit line, with the bit line being electrically isolated from the word line. The present invention makes use of these elements, but in a unique overall structure comprising a plurality of vertical channel DRAM cells which allows for a smaller feature size and more compact individually-addressable DRAM cells.

SUMMARY

The present invention relates to an overall matrix for the location of individually-addressable DRAM cells and to a method of creating a buried bit line in combination with a gate-all-around wordline within that overall matrix.

The overall matrix of the vertical channel DRAM includes a plurality of buried bit lines and electrically isolated, buried word lines in a solid structure which is typically quadrilateral, where the sides of the structure are frequently at right angles to provide for efficient manufacturing, packaging and placement relative to other active devices which make use of the DRAM. Previous DRAM architecture typically made use of a bit line and a word line which were located at various other angles with respect to each other. While it is possible to create the buried bit lines of the present invention to be at an angle other than a right angle with respect to the word lines within the DRAM cells, this is a less preferred embodiment. When the bit lines and word lines are located at right angles, this enables better plasma processing of the materials which make up the architecture, and closer packing of the dram cells in the cell array. If required for a particular application, a DRAM matrix structure may be varied in terms of exterior surface shape of the array. For purposes of discussion herein, the cells within the array have sidewalls which are at right angles. In addition, the exterior overall matrix (array) of cells advantageously has side walls which are at right angles with respect to each other.

For a DRAM cell array, vertical channel transistors can provide area scaling advantage of about 33%. In the past, all contacts for the overall matrix of cells were made from the top of the array and this required additional space. A buried bit line (BBL) with sidewall connections on the exterior surfaces of the cell array is key to provide the most efficient production and functionality for vertical channel transistors for DRAM applications. To be able to use such outside sidewall connections for a cell array, there must be low line resistance along the bit lines. We use a self-aligning process flow to fabricate the BBL with low resistivity, this reduces processing costs and is advantageous for future scaling of banks of DRAM cells.

The present application focuses on the formation of a Gate-All-Around Word Line for a vertical channel DRAM. However, so that the present disclosure will be enabling, applicants are describing the formation of a Buried Bit Line structure into which the gate-all-around word line is integrated.

The starting substrate is typically a regular bulk Si (100) substrate. The method of fabrication used for the present invention requires that the materials and processes used to form the DRAM cell have particular compatibility, as will be discussed subsequently herein.

The starting silicon substrate is first etched to provide parallel trenches within the silicon substrate, where an individual trench has a width critical dimension (CD) of 16 nm or less, with the spacing between trenches also being 16 nm or less, by way of example and not by way of limitation. The depth of the silicon trench is approximately 200 nm. In view of the sizing of the features of the DRAM cell array, a dry plasma etch is recommended for creation of the trenches in the substrate.

The trenches are created by first applying a hard mask blanket of silicon nitride or oxide/nitride dielectric HM. The silicon nitride is applied using low pressure chemical vapor deposition (LPCVD) or plasma enhanced CVD (PECVD). Due to the feature size of the individual dram cells, the finished thickness of a patterned silicon nitride hard mask is typically about 50 nm, but may vary for a different hard masking material.

The trench pattern in the hard mask is frequently created using a material referred to as APF. APF is a strippable amorphous carbon masking material, the residue of which can be easily removed from a patterned silicon nitride hard mask by etching the amorphous carbon using an oxygen-comprising plasma. To provide pattern features of about 20 nm or less in a silicon nitride hard mask, a thin (about 120 nm or less in thickness) chemically amplified photoresist sensitive to DUV or EUV radiation is patterned, and the patterned photoresist is used to transfer the trench pattern into the amorphous carbon masking film. The process for deposition of an amorphous carbon masking material film is typically a CVD process. The apparatus and process for deposition of an amorphous carbon sacrificial hard masking material are commercially available from Applied Materials, Inc., Santa Clara, Calif.

Etching of the silicon trenches is carried out using a plasma etching technique. One plasma feed gas composition which produces good results for etching a silicon nitride hard mask is an $SF_6/CH_4/N_2/O_2$ mixture, by way of example and not by way of limitation. Subsequent to patterning the hard mask, the trenches are etched in the silicon substrate using a plasma gas composition such as $Cl_2$/HBr/He/$O_2$ plasma, by way of example and not by way of limitation. After pattern etching of the hard mask, approximately 50 nm of patterned silicon nitride remains on the silicon surface.

After etching of the trench pattern, to provide for dimensional control of the device structure, it is helpful to use chemical mechanical polishing (CMP) to obtain a flat, planar surface on the device structure. To be able to CMP the surface of the columns of silicon after the pattern etching, an oxide is applied to fill the trenches, to protect and stabilize the rows of etched silicon trenches during planarization. The oxide fill needs to be void-free. The oxide fill is typically carried out using an FCVD process. FCVD (flowable CVD) refers to a method which makes use of a CVD or ALD deposition technique to fill the trenches from the bottom toward the top. The apparatus and the materials necessary to carry out FCVD are commercially available from Applied Materials, Inc. of Santa Clara Calif. This oxide fill provides excellent results, but is mentioned as one possibility, and not by way of limitation.

Subsequent to the oxide fill, a chemical mechanical polishing process (CMP) of the kind well known in the art is used to provide a level upper surface on the substrate. The CMP process is carried out until the upper surface of the residual silicon nitride layer overlying the silicon rows (the sidewalls of the trenches) is reached.

Following the CMP process, an oxide etch back is carried out, where about 170 nm of oxide is removed. The oxide remaining in the bottom of the trenches is then about 80 nm in depth. While it is possible to use a wet etch process which is designed to avoid stiction between silicon columns, a dry etch typically provides advantages. In a recommended technique, a dry etch process employs a hydrogen-comprising source which is frequently ammonia ($NH_3$) and a fluorine-comprising source such as nitrogen trifluoride ($NF_3$), which are combined in a remote plasma system (RPS). The plasma flows from the RPS into an etch processing chamber to provide the oxide etch back. Typically the relative flow rates of the precursors used to form the plasma etchant are adjusted so that a ratio of the atomic % of hydrogen present in the plasma relative to the atomic % of fluorine ranges from about 1:1 to about 20:1, so that a smooth etched surface is obtained, where the average surface roughness is typically about 1 nm to 2 nm Ra. This dry etch process and an apparatus for carrying out the process are commercially available from Applied Materials, Inc. of Santa Clara, Calif.

Following the oxide etch back, a silicon nitride layer ranging in thickness from about 2.5 nm to about 3.5 nm is deposited over the exposed surfaces of the substrate using LPCVD. Following the silicon nitride deposition, a directional, anisotropic, etch of the silicon nitride layer is carried out. After this etch, about 40 nm of silicon nitride remains on the top of the trench sidewalls, about 3±0.5 nm remains on the sidewalls of the trenches, and 0 nm remains at the bottom of the trenches, due to removal of about 4 nm (3 nm plus a 33% overetch). About 1 nm of silicon oxide is removed from the bottom of the trench during the etch back step.

After the anisotropic etch of the silicon nitride, an isotropic, silicon oxide etch is carried out using an etchant which has a selectivity of about 30:1 or greater of oxide relative to nitride. A dry etch is typically used because of the dimensions of the trenches and the desire to avoid stiction. About 40 nm of oxide is removed from the bottom of the trench. Simultaneously, the 2.5 nm to 3.5 nm thick layer of oxide which is present under the lower end of the silicon nitride sidewall is removed, to expose the silicon sidewall beneath. The remaining oxide at the bottom of the trench is about 40 nm in thickness.

One advantageous plasma etchant which may be used during the isotropic silicon oxide etch is an $NH_3$/$NF_3$ plasma previously described, which provides an advantageously smooth surface. This etch process is commercially available from Applied Materials, Inc. of Santa Clara, Calif. and is frequently referred to as "Siconi".

Conformal doping of the exposed silicon surfaces beneath the silicon nitride sidewall layer may be carried out using a dopant such as phosphorous (P) or arsenic (As). The doping is typically applied using SEG epi with in-situ P or As, or using plasma doping, where the dopant may be As or P, or PSG oxide doping. The conformal doping is followed by Rapid Thermal Annealing (RTA) at a temperature of about 1000° C. for about 30 seconds, to provide outward, uniform distribution of the dopant into the silicon sidewall from each direction toward the center of the silicon sidewall. The uniformly doped area functional doping density is typically greater than 5.E+19 $cm^{-3}$, and is frequently in the range of 1.E+20 $cm^{-3}$. Subsequently, the surfaces of the patterned structure are cleaned, using a dry HF etch or the Siconi process previously described, by way of example and not by way of limitation. When the SEG with in-situ P or As is used to apply the dopant, it is not necessary to use a clean up step.

After the surface cleaning, a metal silicide is formed to provide conductive contacts for the bit line. To form the metal silicide, about 3 nm of Co metal or another metal selected from the group consisting of Co, Pt, Ni—Pt, Ti, Er, or combinations thereof, is deposited by a CVD technique over the interior surfaces of the patterned trenches; this is followed by ALD deposition of about 5 nm of TiN. Cobalt has been found to work particularly well when used to form the metal silicide. The TiN provides a metal cap to protect the cobalt metal during an RTA which is used to form the metal silicide. In one embodiment, a two step RTA is used to create the silicide, where the first RTA is carried out at about 500° C. for about 10 seconds to about 30 seconds to form $CO_2Si$; and a second RTA is carried out at about 850° C. for a time period of about 20 seconds to about 40 seconds to form $COSi_2$, which provides reduced sheet resistance along the bit line. After the first RTA treatment, the TiN cap used to protect the cobalt during RTA, and un-reacted cobalt are stripped off using a wet process etchant referred to in the industry as SPM. SPM si a combination of sulfuric acid and hydrogen peroxide. The second RTA is then carried out. Full silicidation of the exterior surfaces of the doped regions of the silicon columns can be achieved in this manner.

Since the bit line contacts are doped, the only metal contacts necessary for the bit line are on the outside metal silicide layer which is in contact with the doped regions of the block DRAM cell array.

Residual metals present on the exterior silicon sidewall surface and, optionally, the 3 nm silicon nitride sidewall layer above the metal silicide area may then be stripped from the exterior of the silicon sidewalls using an ME process of the kind previously described with respect to the removal of silicon nitride. The decision about whether the silicon nitride sidewall layer will be stripped at this time depends on overall process integration with a word line which will subsequently be formed as part of the DRAM.

Finally, an FCVD oxide fill and cure, of the kind described above are carried out, to stabilize the structure, followed by CMP, stopping on nitride, to complete a buried bit line structure.

To begin formation of the word line structure, the buried bit line structure is then etched to form word line trenches which are at right angles (perpendicular) to the direction of the buried bit lines. The pitch of the wordlines is the same as the pitch of the bit lines. However, the patterned trenches have a CD of about 24 nm, which is about ¾ of the pitch of the bit lines (rather than ½ of the pitch, which was used for the bit line patterning). The trench etching is carried out in the manner described with respect to the etching of trenches to form the buried bit line. The trench pattern in the hard mask is frequently created using the process referred to above as APF. The plasma etchant used needs to etch silicon nitride-capped silicon columns and silicon oxide columns at the same rate. The combination of plasma source gases for etching the silicon/silicon oxide trenches are typically $Cl_2/HBr/He/O_2$, by way of example and not by way of limitation. Other possible plasma source gas combinations which may be used include $CHF_3/CF_4/O_2$ or $NF_3/CH_4/N_2$, by way of example, and not by way of limitation. The silicon and silicon oxide surfaces are etched back to a depth which is approximately 5 nm above the bit line, leaving about 115 nm of vertical silicon sidewall exposed on the silicon column sidewalls.

The trenches are then filled with a dielectric (typically silicon oxide) using a method such as FCVD, followed by CMP to planarize, stopping on the silicon nitride caps present on the upper surfaces of silicon columns which were formed by etching of the silicon/silicon oxide trenches. The oxide is then etched back to a depth which is about 20 nm above the top of the buried bit line, by employing an etchant plasma such as an $NH_3/NF_3$ plasma which provides a particularly smooth etched surface. Such a technique is available from Applied Materials, Inc. and is referred to as a "Siconi" clean.

A conformal liner is then deposited over the surfaces of the silicon columns extending above the oxide which is present above the top of the buried bit line. The thickness of the conformal liner is slightly over ¼ of the pitch (about 9 nm thick). The material used to form the conformal liner may be α-carbon, for example and not by way of limitation. The conformal liner is then etched back to form spacers in the wordline direction (where the opening is ¾ of the pitch), but filling in the bit line direction (where the opening is about ½ of the pitch). The remaining opening (about ¼ of the pitch, i.e. 8 nm) of the wordline trench is filled with fill oxide (for example by using FCVD), followed by CMP to planarize the surface of the structure.

The spacers (formed from α-carbon, for example) are then removed, typically by ashing, to expose wordline trenches surrounding the silicon columns. The result is wordline trenches which have a CD of about 24 nm, where the trenches and surround a silicon column which is about 8 nm in the wordline direction and about 16 nm in the bit line direction.

The surfaces of the silicon columns are then cleaned using an $NH_3/NF_3$ plasma which provides a particularly smooth etched surface, such a technique is available from Applied Materials, Inc. and is referred to as a "Siconi" clean. This is followed by creation of a gate oxide having a thickness of about 5 nm on the sidewalls of the silicon columns, using a conformal oxidation process. Conformal oxidation may be achieved using a process available from Applied Materials, Inc. of Santa Clara Calif. which is referred to as the "RadOx" process, or a similar process known in the semiconductor processing industry.

After formation of the gate oxide, the wordline is formed by depositing a barrier layer of titanium nitride (TiN) or tungsten nitride (WN) over exposed surfaces within the wordline trenches using ALD/CVD, followed by a CVD of tungsten fill, by way of example and not by way of limitation, within the trenches. CMP is then used to planarize the surface of the filled trenches, using techniques known in the art.

Subsequently, the tungsten fill (and the titanium nitride or tungsten nitride barrier layer) is etched back, using techniques known in the art, to produce a vertical channel length of about 80 nm. The top of the gate is about 20 nm below the bottom of the silicon nitride hardmask caps.

A dielectric fill, typically accomplished using the FCVD fill previously described, is then carried out, followed by CMP planarization to complete the buried wordline structure.

Depending on the finalized design of the DRAM, after the oxide fill and CMP planarization, the silicon nitride caps present at the tops of the silicon column are stripped away using an etch procedure of the kind described above. After the nitride open, the drain of the transistor can be formed by either selective epi of in-situ doped n-Si or by blanket doped n-poly with etch back and anneal.

DETAILED DESCRIPTION OF EXEMPLARY EMBODIMENTS

Figure 1:
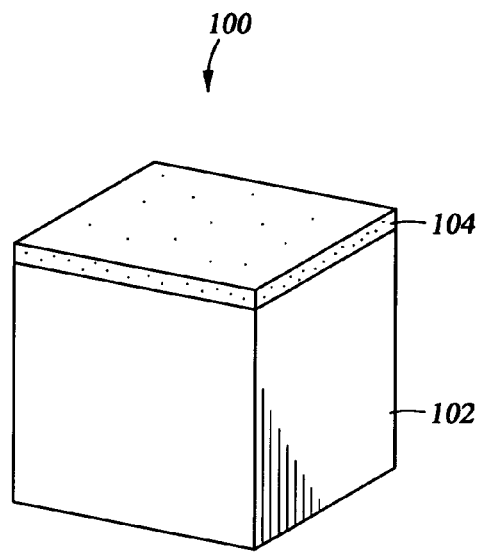
FIG. 1 shows a schematic drawing of a structure 100 with a silicon substrate 102 and with a silicon nitride layer 104 overlying silicon substrate 102.

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The present invention relates to an overall matrix for the location of individually-addressable DRAM cells and to a method of creating a buried wordline within that overall matrix. The present invention structure is described with reference to a related invention, which pertains to fabrication of a buried bit line. That structure is further processed to create a completed DRAM device structure, including a plurality of buried bit lines with accompanying electrically isolated buried wordlines, where an exterior upper surface of the structure is ready for capacitor application to each individually addressable DRAM cell. The patent application for the present invention and the patent application for the related invention are being filed simultaneously to provide the same priority date.

The overall matrix of the vertical channel DRAM includes a plurality of buried bit lines and electrically isolated, buried word lines in a solid structure which is typically quadrilateral, where the sides of the structure are frequently at right angles to provide for efficient manufacturing, packaging and placement relative to other active devices which make use of the DRAM. However, if advantageous for a particular application, the matrix structure may be varied in terms of exterior surface shape. For purposes of discussion herein, the overall matrix is a rectangular shape with sidewall corners being at right angles.

For a DRAM cell array, vertical channel transistors can provide area scaling advantage of about 33%. A buried bit line (BBL) is one of the features which enables such transistors for DRAM applications. We use a self-aligning process flow to fabricate the BBL with low resistivity, which will be advantageous for future scaling of banks of DRAM cells.

The starting substrate is a quality silicon bulk (100) wafer. The method of fabrication used for the present invention requires that the materials and processes used to form the DRAM cell have particular compatibility. For example, the materials used are selected based on etch rate when exposed to various etchants; ease of removal using planarizing techniques; relative coefficients of expansion during thermal processing; performance characteristics of dopants in the presence of materials to be doped; and the like. In the same manner, the processing conditions required for etching, doping, activation of dopants, planarization, metallization, and the like must be compatible with the combination of materials described. We want to provide an exemplary process which is compatible in this manner, and therefore are specifying a particular combination of materials and corresponding processing conditions. However, it is understood that one of skill in the art, in view of the present disclosure, will be able to recommend other materials and processing conditions which may be used. To aid in an understanding of the invention, we will mention additional materials and processing conditions which may be used. However, this is with the understanding that one skilled in the art will select a combination of other materials and processing conditions which are compatible in the manner in which the exemplary process is compatible.

A starting structure 100, is prepared by application of an upper surface layer of silicon nitride 104 over an underlying silicon substrate 102, as shown in FIG. 1. The starting structure 100 is etched through a patterning mask (not shown) to provide a parallel trench pattern in silicon nitride layer 104, which then serves as a hard mask for pattern etching of trenches into the underlying silicon substrate 102. The patterning mask is frequently created using a process referred to as APF, which makes use of a strippable amorphous carbon masking technology for transferring a patterned image into an underlying hard mask such as the silicon nitride hard mask described above. To provide for etching features of about 20 nm or lower. A thin (120 nm or less in thickness) chemically amplified photoresist sensitive to DUV or EUV radiation is patterned, and the patterned photoresist is used to transfer the trench pattern into the APF amorphous carbon masking film. The APF (Advanced Patterning Film) apparatus and processes for film deposition are available commercially from Applied Materials, Inc., Santa Clara, Calif.

An individual trench has a width critical dimension (CD) of 16 nm, with the spacing between trenches also being 16 nm, so that a final individual DRAM cell which will eventually be produced will be 32 nm×32 nm, by way of example and not by way of limitation. The depth of a trench is typically about 200 nm. The layer of silicon nitride 104 is applied using low pressure chemical vapor deposition (LPCVD), a technique well known in the art. Due to the feature size of the individual DRAM cells, the thickness of the hard mask is typically in the range of about 50 nm, but may vary depending on the hard masking material used.

Figure 2:
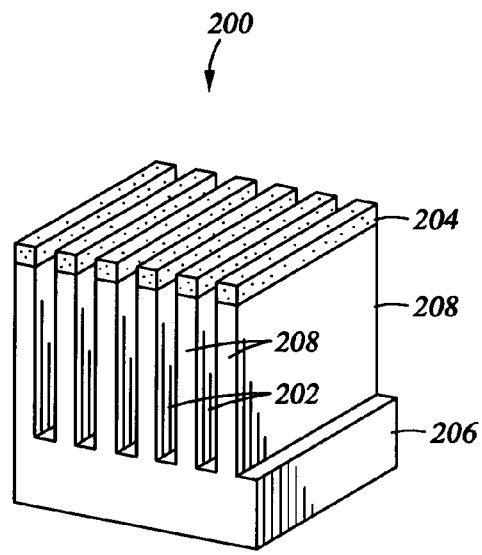
FIG. 2 shows a schematic drawing of a structure 200 which includes trenches 202 which have been etched into the silicon substrate 102, to produce a silicon substrate base 206, silicon trench sidewalls 208 and overlying silicon nitride cap layers 204.

Etching of the silicon trenches is carried out using a plasma etching technique. One plasma feed gas composition which produces good results for etching a silicon nitride hard mask is an $SF_6/CH_4/N_2/O_2$ mixture, by way of example and not by way of limitation. Subsequent to patterning the hard mask, the trenches are etched in the silicon substrate using a plasma gas composition such as $Cl_2/HBr/He/O_2$ plasma, by way of example and not by way of limitation. After pattern etching of the hard mask, approximately 50 nm of patterned silicon nitride remains on the silicon surface. FIG. 2 shows the etched structure, where wo4 represents the layer of patterned silicon nitride remaining, 208 represents the silicon column sidewalls, 202 represents the trenches between the silicon columns 208, and 206 represents the silicon base present beneath etched trenches 202.

Figure 3:
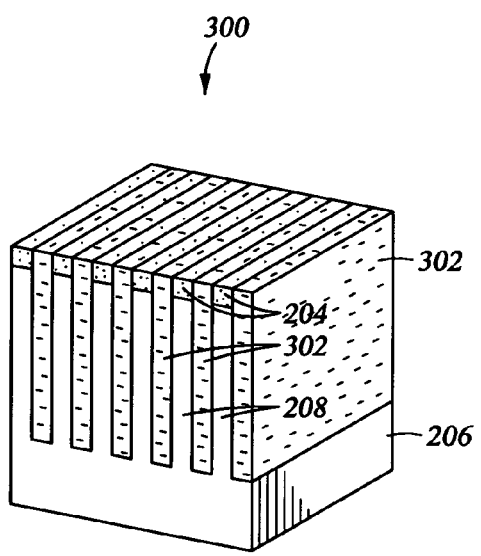
FIG. 3 shows a schematic drawing of a structure 300 which includes the silicon substrate base 206 and silicon trench sidewalls 208 with silicon nitride cap layers 204, after a silicon oxide fill 302 has been applied to fill the interior of trenches 202 (not shown).

After etching of the trench pattern, to provide for dimensional control of the device structure, it is helpful to use chemical mechanical polishing (CMP) to obtain a flat, planar surface on the device structure. To be able to CMP the surface of the columns of silicon after the pattern etching, an oxide is applied to fill the trenches, to protect and stabilize the rows of etched silicon trenches during planarization. The oxide fill needs to be void-free. The oxide fill is typically carried out using an FCVD process. FCVD (flowable CVD) refers to a method which makes use of a CVD or ALD deposition technique to fill the trenches from the bottom toward the top. The apparatus and the materials necessary to carry out FCVD are commercially available from Applied Materials, Inc. of Santa Clara Calif. This oxide fill is an example and is not intended to limit the method of silicon oxide fill which may be used. FIG. 3 illustrates the structure 300 which represents the 302 oxide-filled rows surrounding silicon columns 208.

Figure 4:
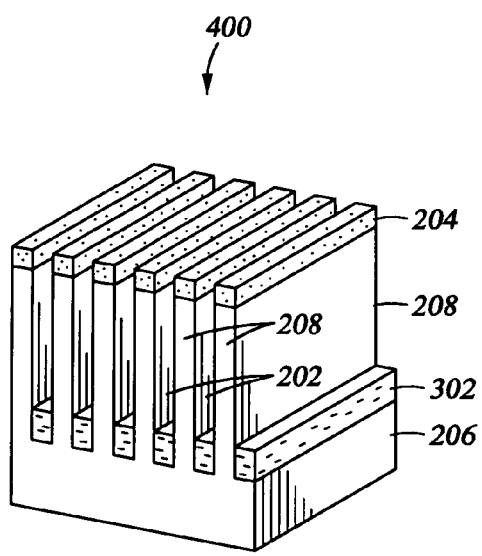
FIG. 4 shows a schematic drawing of a structure 400 which is produced from structure 300 after an etch back of the silicon oxide fill 302, where a layer of silicon oxide fill 302 is present only at the base of trenches 202.

Subsequent to the oxide fill, a chemical mechanical polishing process (CMP) of the kind well known in the art is used to provide a level upper surface on the substrate. The CMP process is carried out until the upper surface of the residual silicon nitride layer overlying the silicon rows (the sidewalls of the trenches) is reached. Following the CMP process, an oxide etch back is carried out, where about 160 nm of oxide is removed from within the silicon trenches 202. The Finished etched structure 400 is shown in FIG. 4, where the patterned layer of silicon nitride 204 is present on the upper surfaces of the silicon columns 208, and the remaining oxide fill 302 is present at the bottom of trenches 202 overlying silicon base 206. The oxide remaining in the bottom of the trenches 202 is then about 90 nm in height (deep). The oxide etch back may be carried out using a reactive ion etch (RIE) technique known in the art, where the etchant has a selectivity with respect to silicon nitride of about 10:1 or greater. Other techniques which may be used for removal of oxide include an etch process which employs a hydrogen-comprising source such as ammonia ($NH_3$) and a fluorine-comprising source of nitrogen, such as nitrogen trifluoride ($NF_3$), which are combined in a remote plasma system (RPS). The RPS system provides plasma flow into an etch processing chamber to provide the oxide etch back. Typically the relative flow rates of the precursors used to form the plasma etchant are adjusted so that a ratio of the atomic % of hydrogen present in the plasma relative to the atomic % of fluorine ranges from about 1:1 to about 20:1, so that a smoother etched surface is produced, where the average surface roughness is about 1 nm Ra to 2 nm Ra. This dry etch process and an apparatus for carrying out the process are commercially available from Applied Materials, Inc. of Santa Clara, Calif. As an alternative to a dry etch, the oxide etchback may be conducted using a wet etch back of the kind known in the art.

Figures 5, 6:
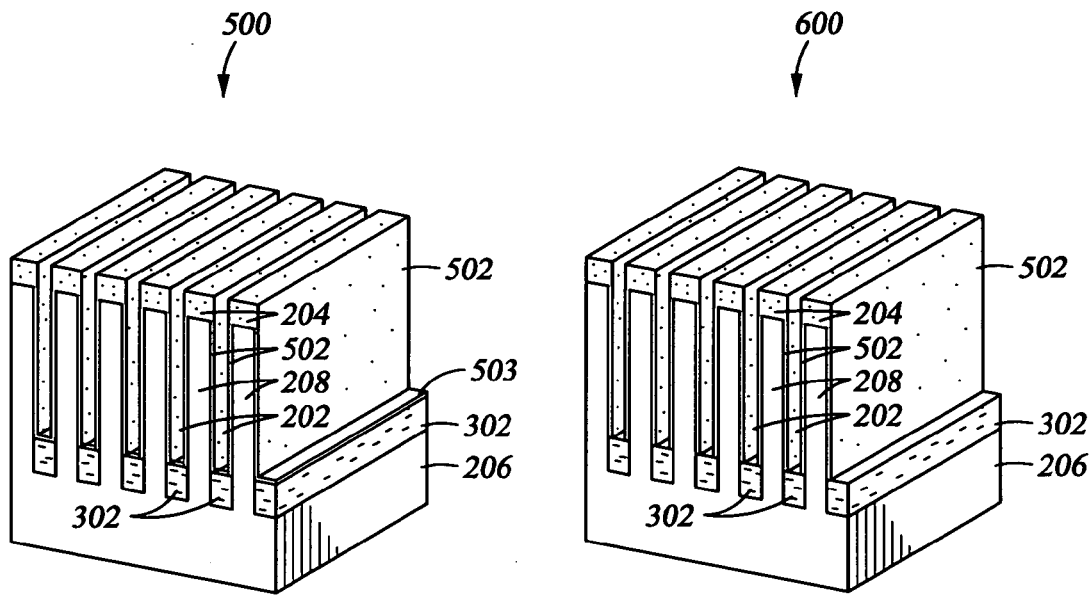
FIG. 5 shows a schematic drawing of a structure 500 which is produced from structure 400 by deposition of additional silicon nitride to form a silicon nitride spacer wall 502 over the sidewalls of silicon columns 208.
FIG. 6 shows a schematic drawing of a structure 600 where anisotropic etching has been used to etch silicon nitride spacer material off the upper surface of oxide fill 302.

Following the oxide etch back, a silicon nitride layer ranging in thickness from about 2.5 nm to about 3.5 nm is deposited over the exposed surfaces of the substrate using LPCVD. This is illustrated in FIG. 5, where an additional amount of silicon nitride is deposited on the caps at the top of silicon columns 208, is deposited as a layer 502 on the outer surfaces of the silicon column 208 sidewalls, and is deposited as a layer 503 overlying the upper surfaces of etched oxide fill 302 in trenches 202.

To remove the silicon nitride layer 503 from the bottom of trenches 202, a directional, anisotropic etch of the silicon nitride layer is carried out. This anisotropic etch is used to remove about 4 nm of silicon nitride 503 which was deposited at the bottom of trenches 202. About 1 nm of silicon oxide is also removed from the bottom of the trench during removal of silicon nitride from the bottom of the trench. FIG. 6 illustrates the structure 600 which is produced after the anisotropic etch. Typically, the remaining silicon nitride thickness of the caps 204 present on the upper surfaces of silicon columns 208 is about 40 nm, and the silicon nitride thickness on the sidewalls of the trenches is about 3±0.5 nm. No silicon nitride remains at the bottom of the trenches, due to removal of the 4 nm (3 nm plus a 33% overetch).

Figures 7, 8:
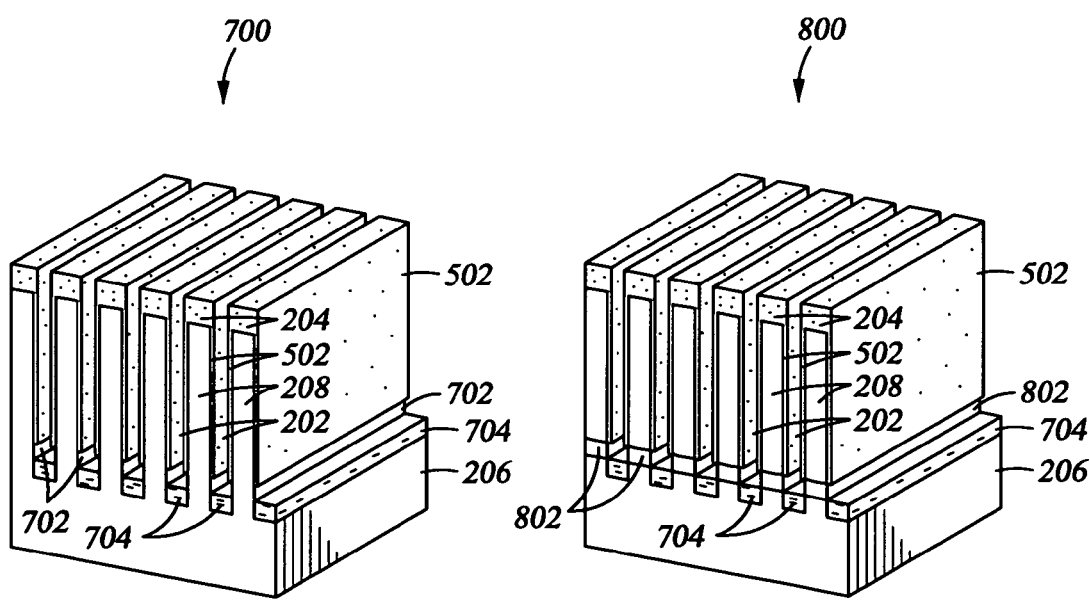
FIG. 7 shows a schematic drawing of a structure 700, where isotropic etching has been used to etch the thin layer of oxide 602 off beneath the silicon nitride spacer wall 502, leaving an exposed silicon sidewall surface 702, while simultaneously etching oxide fill layer 302 to reduce the thickness of this layer and create a spacing 702 between the bottom of silicon nitride spacer wall 502 where a sidewall of silicon columns 208 is exposed.
FIG. 8 shows a schematic drawing of a structure 800 where a dopant has been inserted into the exposed silicon sidewall surface 702 to form a doped area 802 within the silicon columns 208 at the base of the silicon nitride spacer wall 502.

After the anisotropic etch of the silicon nitride, an isotropic silicon oxide etch is carried out using an etchant which has a selectivity of about 30:1 or greater of oxide relative to nitride. A dry etch is typically used, because of the dimensions of the trenches and the desire to avoid stiction. As illustrated in FIG. 7, about 40 nm of oxide is removed from the bottom of the trench, to form a new oxide layer 704, and leaving a gap of about 40 nm between the top of oxide layer 704 and the bottom of the silicon nitride layer 502 on the sidewalls of the trenches 202. Simultaneously, the 2.5 nm to 3 nm thick layer of oxide which was present under the lower end of silicon nitride sidewall 502 is removed, to expose the silicon sidewall 702 beneath to a depth of about 40 nm. The remaining oxide at the bottom the trench is about 50 nm in thickness.

One advantageous technique for oxide removal is a silicon etch employing an $NH_3/NF_3$ plasma which provides a particularly smooth etched surface, such a technique is available from Applied Materials, Inc. and is referred to as a "Siconi" clean.

Conformal doping of the exposed silicon surfaces beneath the silicon nitride sidewall layer may be carried out using a dopant such as phosphorous (P) or arsenic (As). The doping is typically applied using SEG epi with in-situ P or As, or using plasma doping, where the dopant may be As or P, or PSG oxide doping. The conformal doping is followed by Rapid Thermal Annealing (RTA) at a temperature of about 1000° C. for about 30 seconds, to provide outward, uniform distribution of the dopant into the silicon sidewall from each direction toward the center of the silicon sidewall. The uniformly doped area functional doping density is typically greater than $5.E+19$ cm$^{-3}$, and is frequently in the range of $1.E+20$ cm$^{-3}$. Subsequently, the surfaces of the patterned structure are cleaned, using a dry HF etch or the Siconi process previously described, by way of example and not by way of limitation. When the SEG with in-situ P or As is used to apply the dopant, it is not necessary to use a clean up step. Conformal doping of the exposed trench sidewall 702 is illustrated in FIG. 8, where the conformally doped area is numbered 802.

Figure 9:
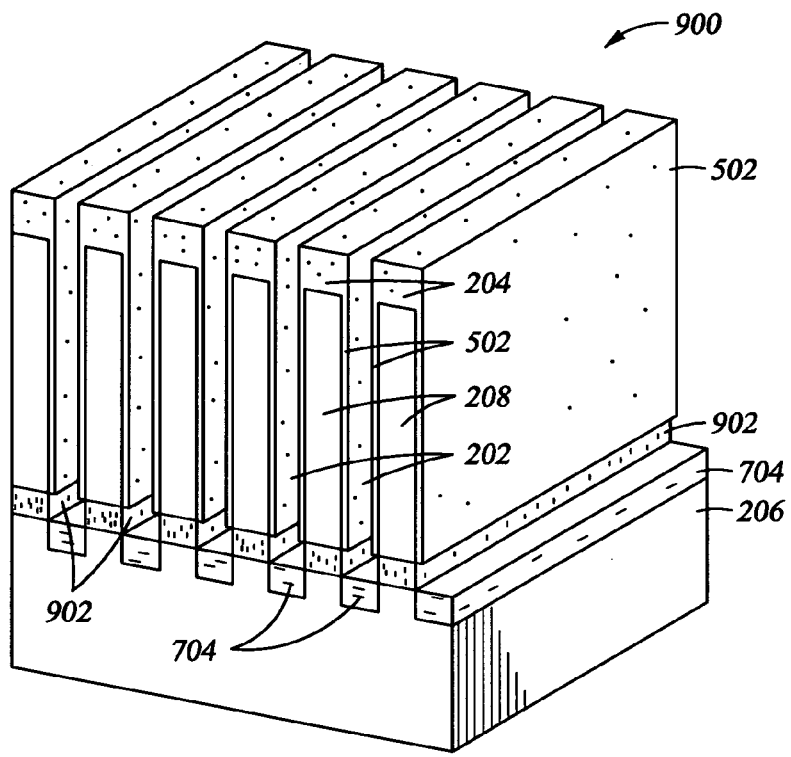
FIG. 9 shows a schematic drawing of a structure 900 which is produced from structure 800, where a metal silicide layer 902 has been created over the exterior surface of the doped area 802.

After the surface cleaning, a metal silicide is formed to provide conductive contacts for the bit line. To form the metal silicide, about 3 nm of Co metal or another metal selected from the group consisting of Co, Pt, Ni—Pt, Ti, Er, or combinations thereof, is deposited by a CVD or ALD technique over the interior surfaces of the patterned trenches; this is followed by ALD deposition of about 5 nm of TiN. Cobalt has been found to work particularly well when used to form the metal silicide. The TiN provides a metal cap to protect the cobalt metal during an RTA which is used to form the metal silicide. In one embodiment, a two step RTA is used to create the silicide, where the first RTA is carried out at about 500° C. for about 10 seconds to about 30 seconds to form $CO_2Si$. Subsequently, unreacted Co and the TiN are stripped off using a wet etch of the kind known in the art, followed by a second RTA at about 850° C. for a time period of about 20 seconds to about 40 seconds to form $COSi_2$, which provides reduced sheet resistance along the bit line. Full silicidation of the exterior surfaces of the doped regions of the silicon columns can be achieved in this manner. The structure formed is shown in FIG. 9, where a metal silicide layer 902 is present at the base of each silicon trench sidewall 208.

Figure 10:
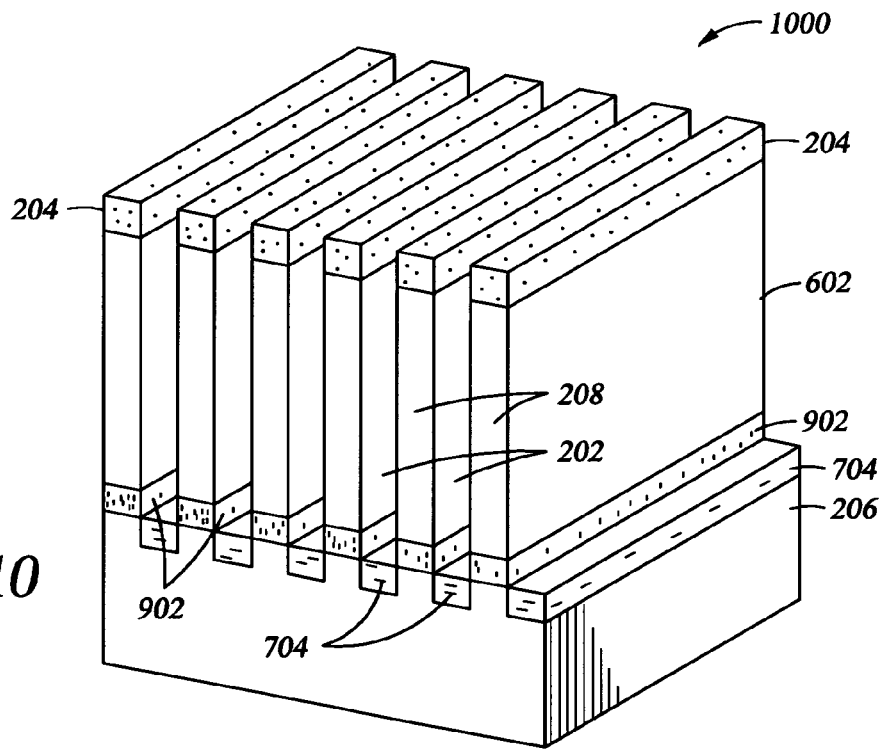
FIG. 10 shows a schematic drawing of a structure 1000 which is produced from structure 900 by isotropic etching to remove the silicon nitride spacer walls 502 shown in FIG. 9.

Subsequent to the creation of the metal silicide layer 902, the protective silicon nitride layer 502 present on the exterior of silicon column 208 sidewalls is removed using a plasma etching process of the kind previously described herein with respect to silicon nitride removal. FIG. 10 illustrates the structure 1000 which is formed after removal of the protective silicon nitride layer 502 which was used to implement the doping of doped area 802 and the formation of the metal silicide layer 902 without the contamination of silicon areas present above area 902.

Figure 11:
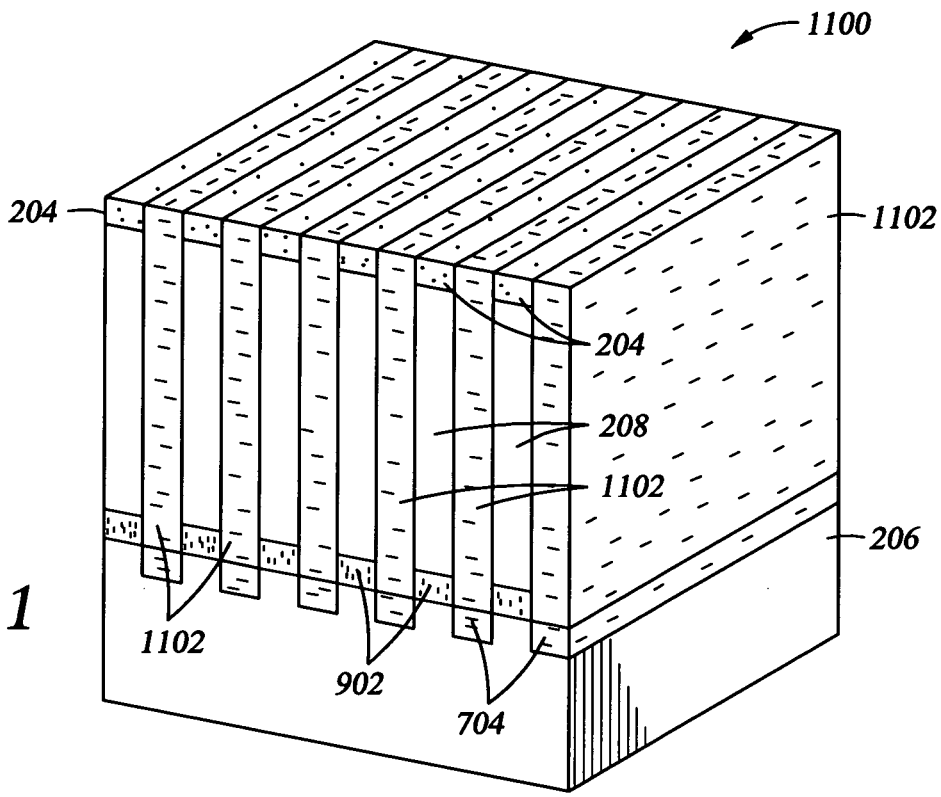
FIG. 11 shows a schematic drawing of a completed buried bit line structure 1100, where an oxide 1102 has been applied to fill the trenches 202, followed by CMP to provide a level upper surface on structure 1100.

An FCVD oxide fill of the kind previously described herein may be used to complete a buried bit of the kind which is illustrated in FIG. 11, where the oxide fill 1102 protects the buried bit line formed by doped area 902 line, awaiting further processing to form a completed semiconductor device DRAM structure. The upper surface of structure 1100 is planarized using CMP in the manner previously described, prior to proceeding with formation of the word line.

Figure 12:
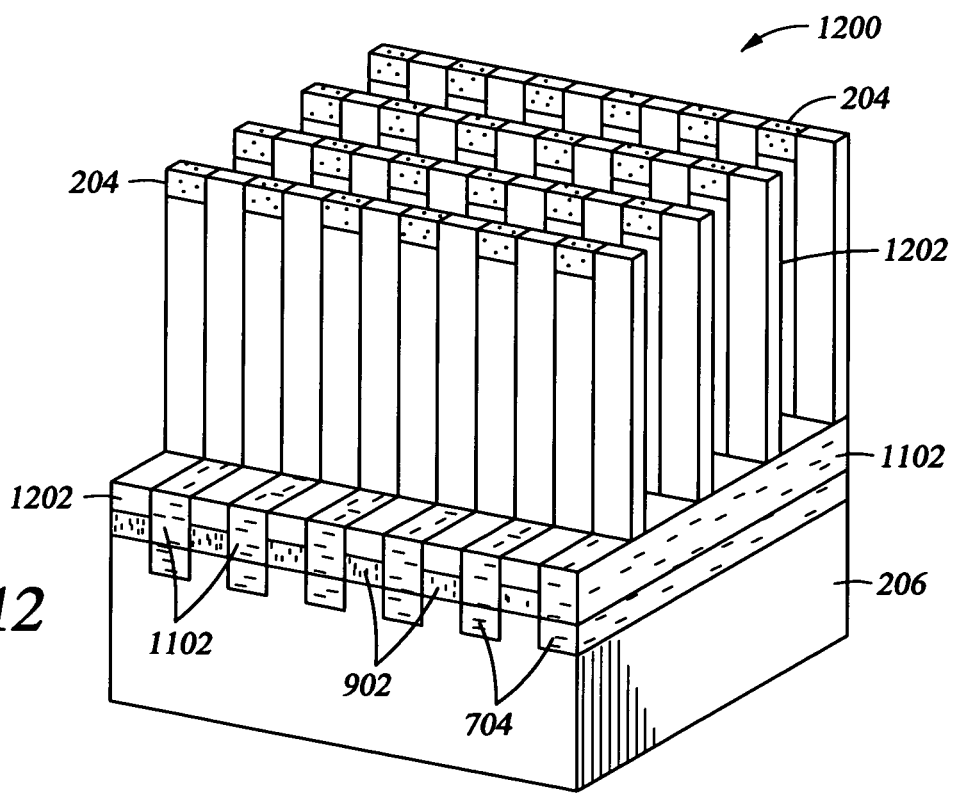
FIG. 12 shows a schematic drawing of the first step toward formation of a gate-all-around word line on the structure containing the completed buried bit line. The structure 1200 shows the buried bit line structure shown in FIG. 11, after pattern etching through silicon oxide 1102, silicon nitride cap 204 and silicon column 208, to form trenches 1202 at a right angle relative to the direction of bit lines 902.

The oxide portion of the buried bit line structure is then etched to form word line trenches which are at right angles (perpendicular) to the direction of the buried bit lines. The pitch of the wordlines is the same as the pitch of the bit lines. However, the patterned trenches have a CD of about 24 nm, which is about ¾ of the pitch is the same as that of the bit lines (rather than ½ of the pitch which was used for the bit line patterning). With reference to FIG. 12, the trench 1202 etching is carried out in the manner described with respect to the etching of trenches to form the buried bit line. The trench pattern in the hard mask is frequently created using the process referred to above as APF. The plasma etchant used needs to etch silicon nitride capped silicon and silicon oxide at the same rate. The plasma source gases for etching the silicon/silicon oxide trenches are typically $Cl_2/HBr/He/O_2$, by way of example and not by way of limitation. Other possible plasma source gas combinations which may be used include $CHF_3/CF_4/O_2$ or $NF_3/CH_4/N_2$, by way of example, and not by way of limitation. The silicon and silicon oxide surfaces are etched back to a depth which is approximately 5 nm above the bit line, leaving about 115 nm of silicon sidewall exposed.

Figure 13:
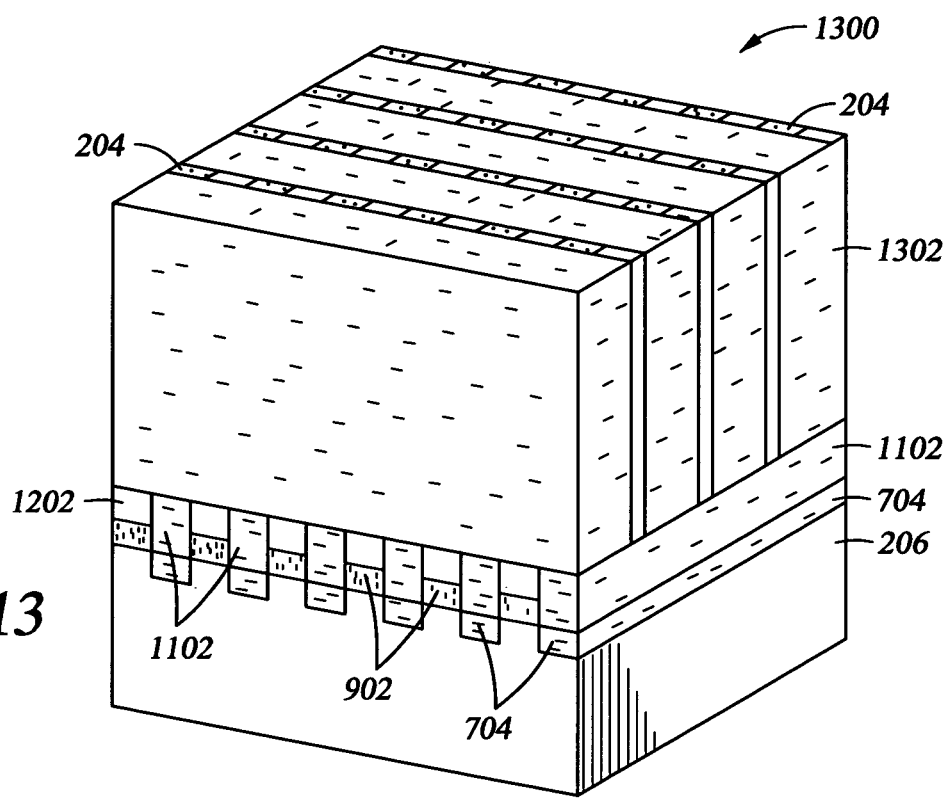
FIG. 13 shows a schematic drawing of a structure 1300 formed from the structure shown in FIG. 12, following an oxide fill 1302 to fill spaces between the trenches 1202 shown in FIG. 12. CMP is then carried out to produce a level upper surface on structure 1300.
Figure 14:
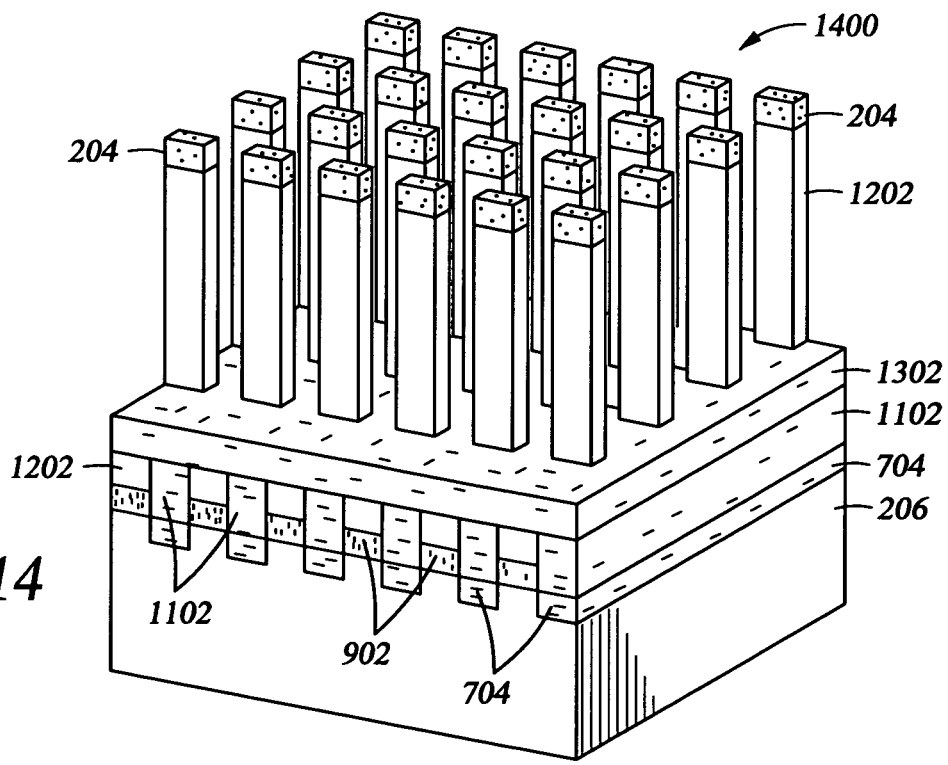
FIG. 14 shows a schematic drawing of the structure generated from that shown in FIG. 13, where an etchback of the oxide layer 1302, has provided a thin oxide isolating layer 1302 overlying silicon surfaces areas created by the etching of the structure shown in FIG. 12.

As shown in FIG. 13, the trenches are then filled with oxide 1302 using a method such as FCVD, followed by CMP to planarize, stopping on the silicon nitride caps present on the upper surfaces of silicon columns which were formed by etching of the silicon/silicon oxide trenches. As shown in FIG. 14, the oxide 1302 is then etched back to a depth which is about 20 nm above the top of the buried bit line 902, by employing an etchant plasma such as an $NH_3/NF_3$ plasma which provides a particularly smooth etched surface. Such a technique is available from Applied Materials, Inc. and is referred to as a "Siconi" clean.

Figure 15:
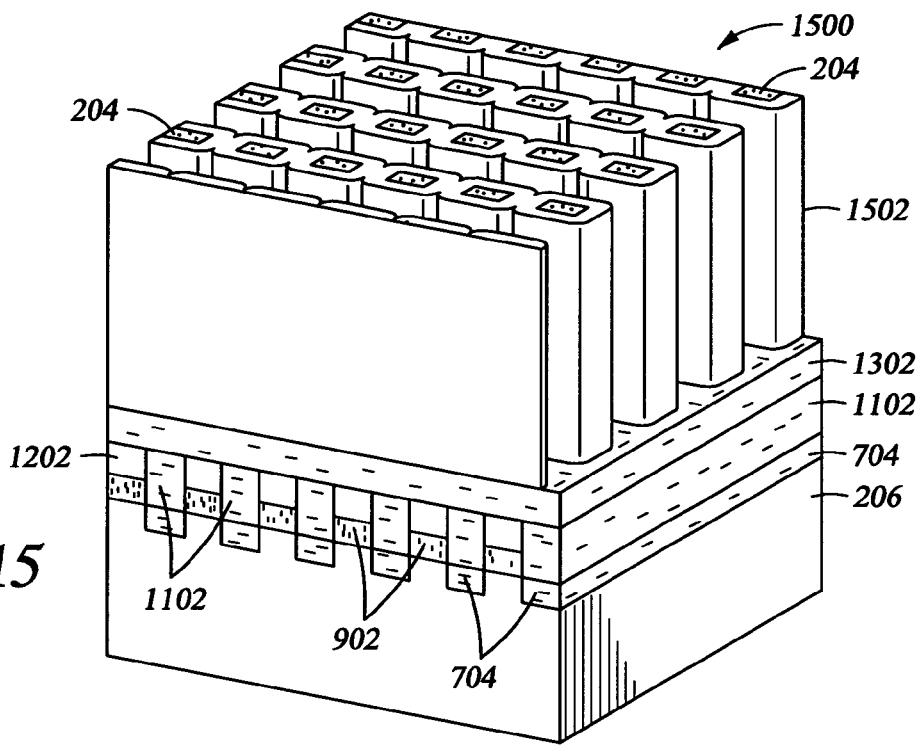
FIG. 15 shows a schematic drawing of a structure 1500 formed from the structure shown in FIG. 14. A conformal layer of alpha carbon (α-carbon) 1502 has been applied over the sidewalls of the silicon columns 208 (not shown), with silicon nitride cap layers 204 showing in the center at the top of the alpha carbon conformal layers 1502.

As illustrated in FIG. 15, a conformal liner 1502 is then applied over the sidewall surfaces of silicon columns 1202 shown in FIG. 14 and the sidewalls of silicon nitride caps 204. The thickness of the conformal liner 1502 is slightly over ¼ of the pitch (about 9 nm thick). The material used to form the conformal liner 1602 may be α-carbon, for example and not by way of limitation. The conformal liner is a space holder, and the material used to form the conformal liner is selected so that it can be easily removed without affecting surrounding materials.

Figure 16:
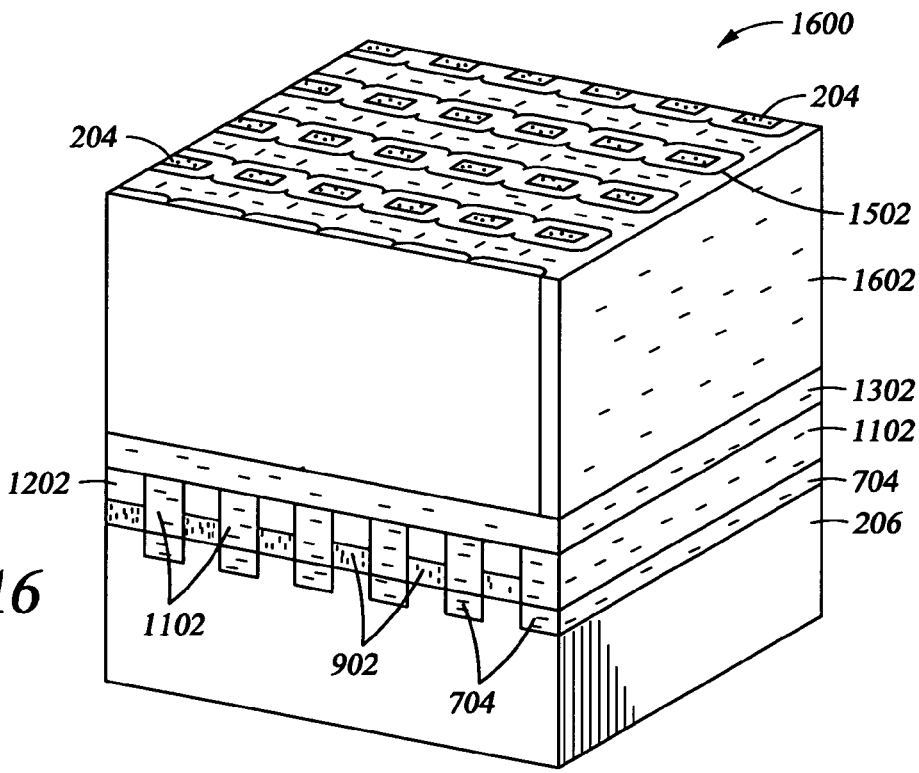
FIG. 16 shows a schematic drawing of a structure 1600 formed from the structure shown in FIG. 15 after the spaces between conformal layers 1502 has been filled with a dielectric layer 1602 (typically an oxide). After application of the dielectric layer, CMP has been carried out so that the upper surface of structure 1600 is planar.

After application of conformal liner 1502, an oxide fill is applied over the exposed surface areas of structure 1500, as shown in FIG. 16. The spaces/opening (about ¼ of the pitch, i.e. 8 nm) in the wordline direction in are filled with the fill oxide (for example by using FCVD), followed by CMP to planarize the surface of the structure 1600.

Figure 17:
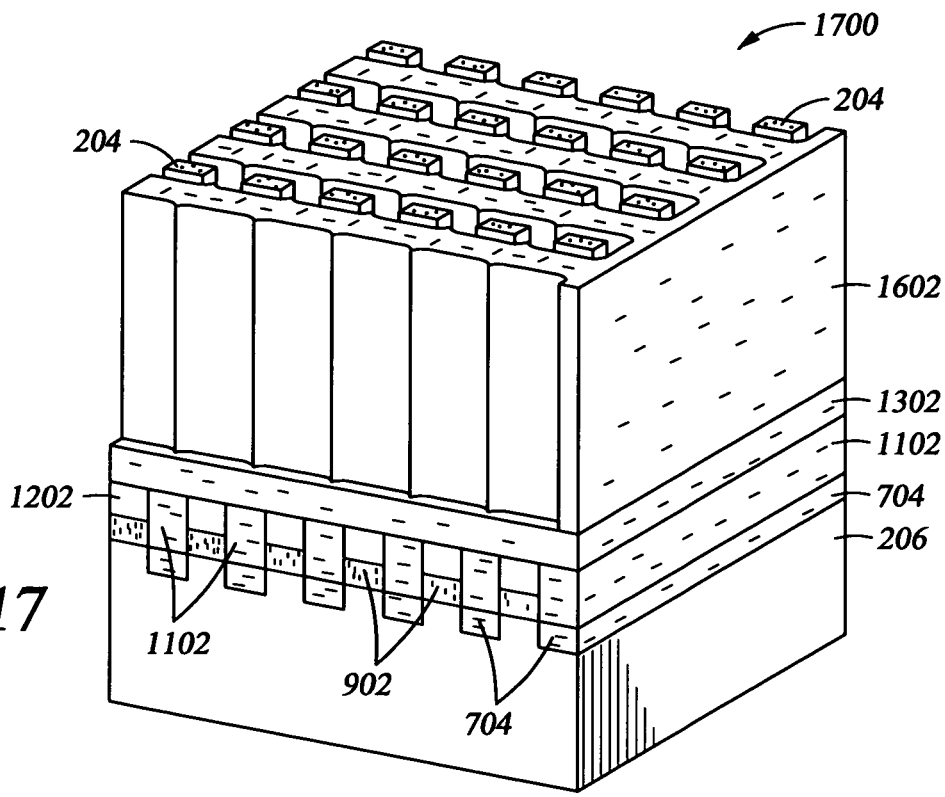
FIG. 17 shows a schematic drawing of a structure 1700 formed from the structure shown in FIG. 1600 after the removal of the conformal layer of alpha carbon 1602 from the structure, to expose the surfaces (not shown) of the silicon columns.

FIG. 17 shows the next step, in which the conformal liner 1602 is etched back to form spaces in the wordline direction (where the opening is ¾ of the pitch), but leaving oxide fill 1702 in the bit line direction (where the opening is about ½ of the pitch). The space-holding conformal liner (formed from α-carbon, for example) is typically removed by ashing, to expose wordline trenches surrounding the silicon columns. The result is wordline trenches have a CD of about 24 nm and surround a silicon column which is about 8 nm in the wordline direction and about 16 nm in the bit line direction. The surfaces of the silicon columns 208 (not shown in FIG. 17) are then cleaned using a silicon etch employing an $NH_3/NF_3$ plasma which provides a particularly smooth etched surface, such as a "Siconi" clean.

Figure 18:
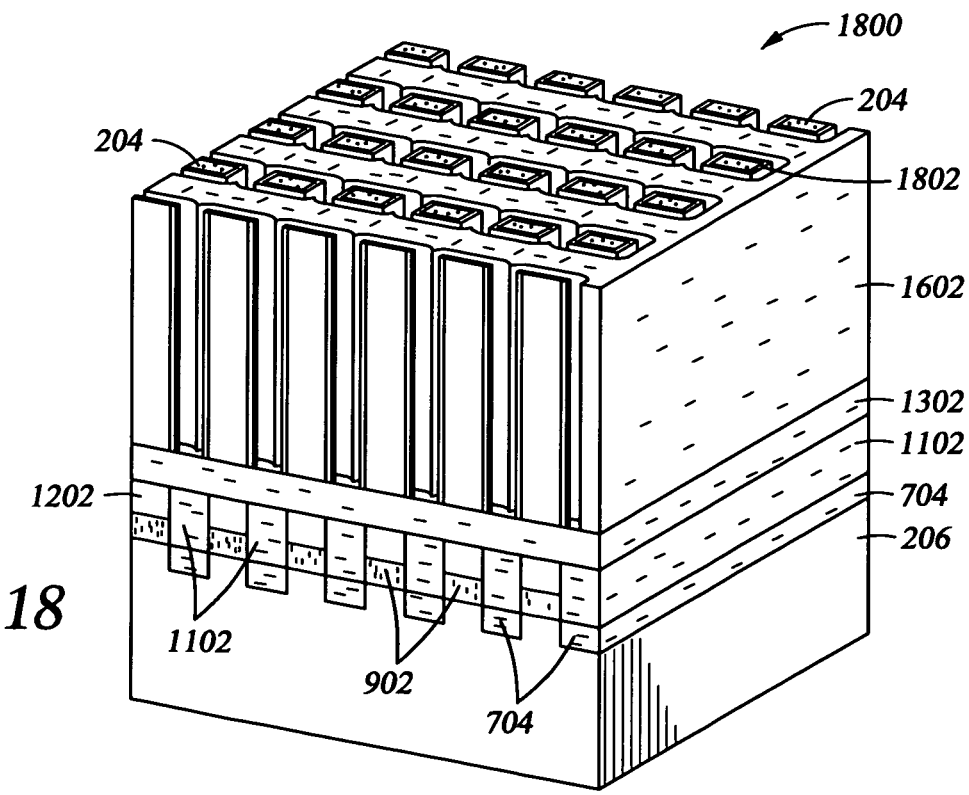
FIG. 18 shows a schematic drawing of the structure 1800 formed from the structure shown in FIG. 17 by the growth of an oxide layer 1802 on the exposed sidewalls of the silicon columns 208 (not shown).

FIG. 18 illustrates the next process step in which a gate oxide 1802 having a thickness of about 5 nm is created on the sidewalls of the silicon columns 208 (not shown in FIG. 18). The gate oxide 1802 is created using a conformal oxidation process. Conformal oxidation may be achieved using a process available from Applied Materials, Inc. of Santa Clara Calif. which is referred to as the "RadOx" process, or a similar process known in the semiconductor processing industry.

Figure 19:
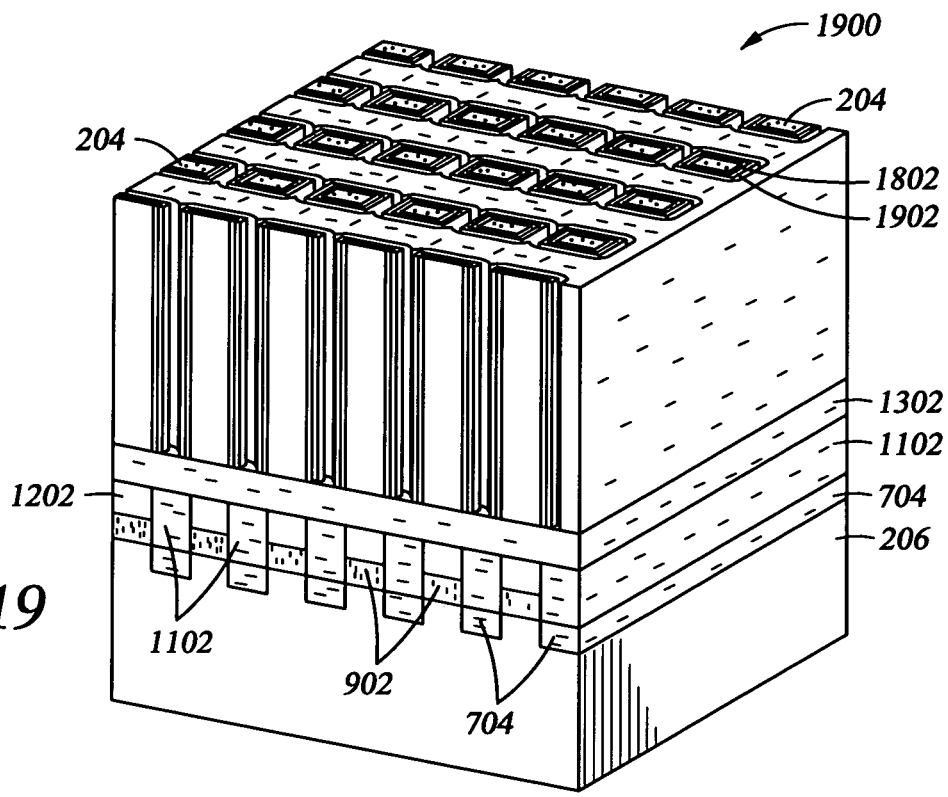
FIG. 19 shows a schematic drawing of a structure 1900 formed from the structure shown in FIG. 18, after the growth of a barrier layer of titanium nitride or tungsten nitride 1902 over the exposed oxide layer 1802 on sidewalls of the of the silicon columns 208 (not shown).

After formation of the gate oxide layer 1802, a barrier layer of titanium nitride (TiN) or tungsten nitride (WN) is applied over exposed oxide 1802 surfaces within the wordline trenches using ALD/CVD. This is illustrated in FIG. 19, which shows the gate oxide 1802 with an overlying barrier layer 1902 present within structure 1900.

Figure 20:
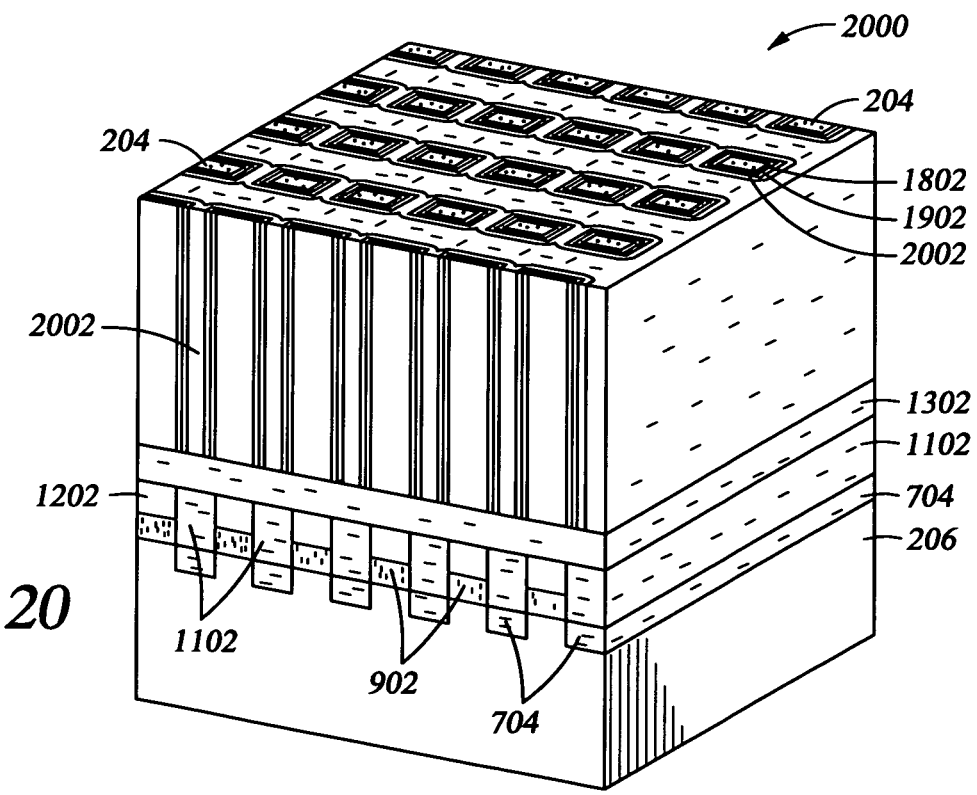
FIG. 20 shows a schematic drawing of a structure 2000 formed from the structure shown in FIG. 19 after an ALD or CVD of a conductive tungsten fill 2002, which fills the spaces between the barrier layers 1902 covering silicon columns 208 (not shown). After deposition of the tungsten fill 2002, the structure is CMP processed to planarize the top of the structure and expose the cell array.

FIG. 20 shows structure 2000 which illustrates the formation of conductive wordline 2002, which is typically formed by CVD or ALD of a tungsten fill 2002 within the wordline trenches. CMP is then used to planarize the surface of the filled trenches, using techniques known in the art.

Figure 21:
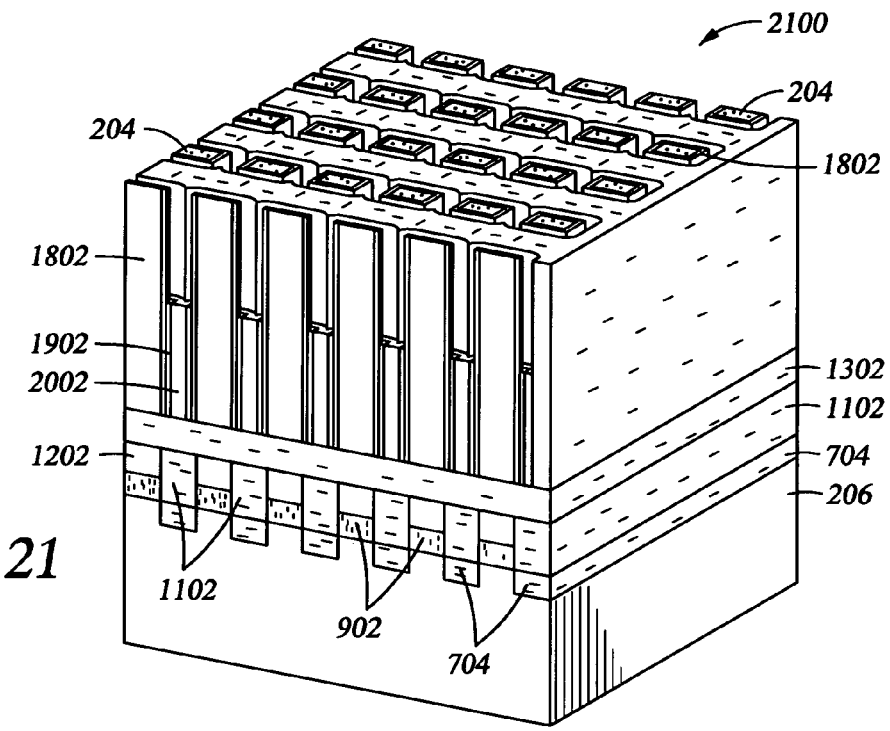
FIG. 21 shows a schematic drawing of a structure 2100 formed from the structure shown in FIG. 20 by an etchback of the barrier layer 1902 and the tungsten fill 2002 to produce the desired height of a wordline.

Subsequently, to provide a wordline of the desired height, the tungsten fill 2002 illustrated in FIG. 20 is then etched back as illustrated in FIG. 21, using techniques known in the art to provide structure 2100. This etch back provides a vertical channel length which may range from about 50 nm to 100 nm.

Figure 22:
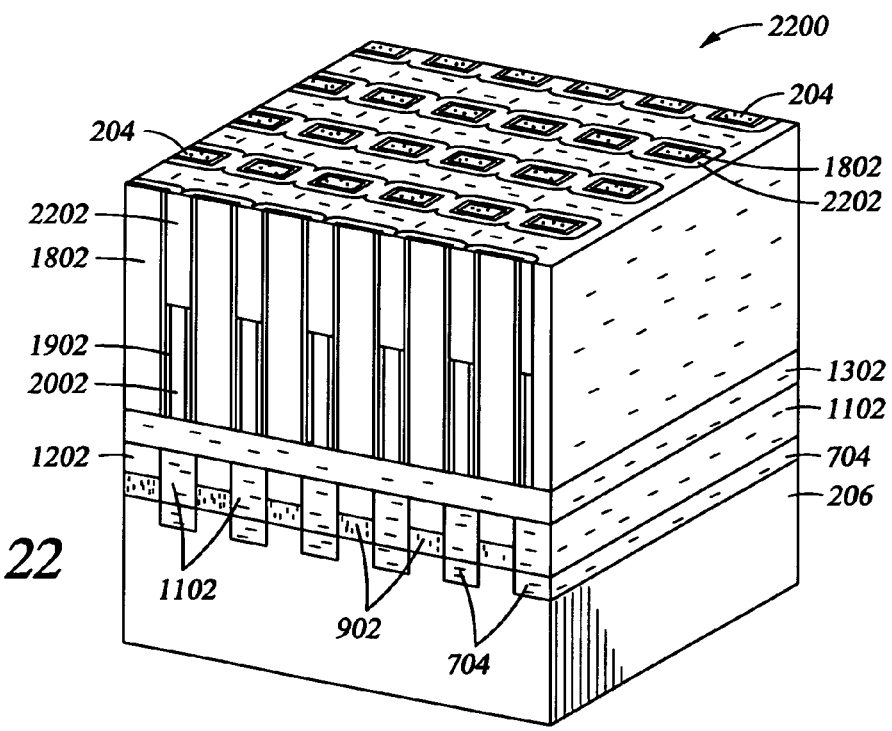
FIG. 22 shows a schematic drawing of a structure 2200 formed from the structure shown in FIG. 21 after an oxide fill 2202 over the exterior surfaces of oxide layer 1802, to produce a buried wordline 2202.

As illustrated in FIG. 22, a dielectric fill 2202, typically formed using the FCVD fill previously described, is carried out to form a completed buried wordline structure 2200. To obtain the desired planarity of the upper surface shown in structure 2200, the dielectric fill 2202 is generally followed by CMP planarization to complete the buried wordline structure 2200.

Figure 23:
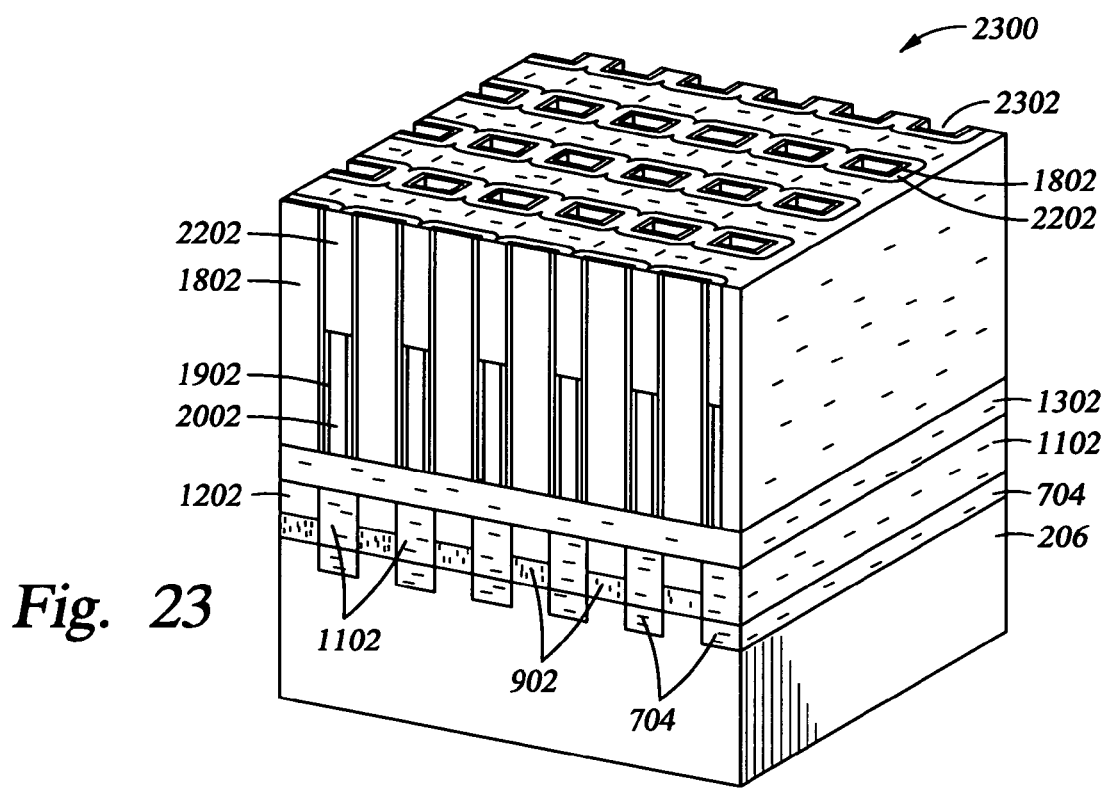
FIG. 23 shows a schematic drawing of the structure 2300 formed from the structure shown in FIG. 22 after removal of the silicon nitride cap 204 to produce a recess 2302 overlying the top of silicon columns (not shown) present within the dram structure shown in FIG. 2300. This structure is ready for formation of the drain of a transistor and attachment of a capacitor at the location of each recess 2302.

Depending on the finalized design of the DRAM, after the oxide fill and CMP planarization, the silicon nitride caps present at the tops of the silicon column are stripped away using an etch procedure of the kind described above. This is illustrated in FIG. 23, which shows a recess 2302 which is created by removal of the silicon nitride caps 204 which were illustrated in FIG. 20.

The recess height is designed to accommodate a capacitor structure which will subsequently be applied overlying the recess structure.

In the description of the steps used to form the DRAM structure containing a buried bit line and a buried wordline, a number of planarization steps are called out. These planarization steps assist in the accurate alignment of portions of the device structure relative to other portions of the device structure. This alignment is very important in fabrication of the device structure. Additional planarization steps may be added if necessary to control the alignment of portions of the device structure, depending on the materials used to fabricate the device.

The above-described exemplary embodiments are not intended to limit the scope of the present invention, as one skilled in the art can, in view of the present disclosure, expand such embodiments to correspond with the subject matter of the invention claimed below.

We claim:

1. Within an integrated process used to form a vertical channel DRAM, a method of fabricating a self-aligned buried wordline which makes up a portion of said vertical channel DRAM, said method comprising:
   a) providing a buried bit line structure which comprises, from bottom to top, a silicon substrate base, a buried bit line overlying said silicon substrate base, rows of silicon columns isolated from each other by rows of oxide dielectric fill, wherein said rows of silicon columns are capped with a silicon nitride capping layer;
   b) blanket depositing an inorganic hard masking material over an upper surface of said buried bit line structure of step a);
   c) patterning said inorganic hard masking material in a manner which permits etching of trenches having a critical dimension of 24 nm or lower;
   d) pattern etching a plurality of trenches into said buried bit line structure in a direction which is perpendicular to the direction of said buried bit lines, wherein, after said pattern etching, rows of silicon columns extend upward from a surface overlying said buried bit lines;
   e) filling said plurality of trenches with an oxide fill;
   f) using chemical mechanical polishing to planarize an upper surface of said structure, stopping on an upper surface of silicon nitride capping layers;
   g) etching back said oxide fill, to provide an isolation layer of oxide present about 20 nm above said buried bit line;
   h) applying a conformal liner of a carbon containing film over surfaces of silicon columns extending above said oxide fill which is present above said buried bit line;
   i) etching back said conformal liner to form spacers in a wordline direction;
   j) applying a layer of a dielectric fill which fills the spaces between said silicon columns covered by said conformal layer of a carbon containing film;
   k) using chemical mechanical polishing to planarize said upper surface of said structure;
   l) removing said etched-back conformal carbon liner-spacer, to open wordline trenches surrounding said silicon columns;
   m) cleaning exposed surfaces of said silicon columns;
   n) creating a gate oxide layer on said exposed surfaces of said silicon columns;
   o) applying a barrier layer over said gate oxide layer;
   p) depositing an electrically conductive fill layer over said barrier layer, to fill said word line trenches which are present as interior spaces between said silicon columns;
   q) using chemical mechanical polishing to planarize the upper surface of the structure, stopping on said silicon nitride capping layer;
   r) etchback of said electrically conductive fill and said barrier layer to produce a desired channel length along the oxide sidewalls of said silicon columns;
   s) applying a layer of dielectric fill, to fill the spaces around the silicon columns which spaces are present overlying said electrically conductive fill, to produce a buried word line; and
   t) using chemical mechanical polishing to planarize the upper surface of the structure, stopping on said silicon nitride capping layer.

2. A method in accordance with claim 1, wherein, subsequent to step t), a step u) is carried out in which said silicon nitride capping layer is removed using an etchant plasma which is selective to silicon nitride relative to the adjacent oxide fill layer, to produce a recess overlying said silicon columns present within said DRAM structure.

3. A method in accordance with claim 1, wherein said step h) conformal liner is formed from α-carbon.

4. A method in accordance with claim 1, wherein said step l) removal of said conformal carbon liner-spacer is carried out by an ashing technique.

5. A method in accordance with claim 1, wherein said step m) cleaning exposed surfaces of said silicon columns is carried out using an $NH_3/NF_3$ plasma to produce a particularly smooth etched surface.

6. A method in accordance with claim 1, wherein said step n) creating a gate oxide layer is carried out using a conformal oxidation process, to produce a gate oxide layer having a thickness of about 5 nm.

7. A method in accordance with claim 1, wherein said step o) barrier layer is formed from a material selected from the group consisting of TiN, WN, and combinations thereof.

8. A method in accordance with claim 1, wherein said step p) conductive fill material is W.

9. A method in accordance with claim 1, wherein said step r) etchback of said electrically conductive fill provides a vertical channel length which ranges from about 50 nm to about 100 nm.

10. A method in accordance with claim 2, wherein said recess produced by removal of said silicon nitride capping layer is designed to accommodate a capacitor structure which will subsequently be applied overlying said recess structure.

\* \* \* \* \*